(12) United States Patent
Adkins et al.

(10) Patent No.: US 6,437,965 B1
(45) Date of Patent: Aug. 20, 2002

(54) ELECTRONIC DEVICE INCLUDING MULTIPLE CAPACITANCE VALUE MEMS CAPACITOR AND ASSOCIATED METHODS

(75) Inventors: Calvin L. Adkins, Malabar; David John Tammen, Satellite Beach, both of FL (US); Michael Alan Gribbons, Mt. Laurel, NJ (US); Jason D. Reed, West Hartford, CT (US); Claude Hilbert; Richard D. Nelson, both of Austin, TX (US)

(73) Assignee: Harris Corporation, Melbourne, FL (US)

( * ) Notice: Subject to any disclaimer, the term of this patent is extended or adjusted under 35 U.S.C. 154(b) by 85 days.

(21) Appl. No.: 09/724,292

(22) Filed: Nov. 28, 2000

(51) Int. Cl.$^7$ .............................................. H01G 4/005
(52) U.S. Cl. .................... 361/303; 361/306.1; 361/290; 361/287; 361/301.1
(58) Field of Search ............................. 361/303, 301.1, 361/306.1, 277, 278, 279, 280, 281, 282, 287, 290, 292, 298.2, 679

(56) References Cited

U.S. PATENT DOCUMENTS

| | | | |
|---|---|---|---|
| 5,726,073 A | 3/1998 | Zhang et al. ................ 437/228 |
| 5,798,283 A | 8/1998 | Montague et al. ............ 438/24 |
| 5,808,527 A | 9/1998 | De Los Santos ............ 333/205 |
| 5,867,302 A | 2/1999 | Fleming ..................... 359/291 |
| 5,880,921 A | 3/1999 | Tham et al. ................. 361/233 |
| 5,959,516 A | 9/1999 | Chang et al. .................. 334/14 |
| 5,963,788 A | 10/1999 | Barron et al. .................. 438/48 |
| 5,974,207 A | 10/1999 | Aksyuk et al. ................ 385/24 |
| 5,989,372 A | 11/1999 | Momoda et al. ......... 156/89.11 |
| 6,094,102 A | * 7/2000 | Chang et al. |
| 6,215,644 B1 | * 4/2001 | Dhuler |
| 6,229,684 B1 | * 5/2001 | Cowen et al. |
| 6,232,847 B1 | * 5/2001 | Marcy, 5th et al. |
| 6,347,237 B1 | * 2/2002 | Eden et al. |

OTHER PUBLICATIONS

Barker et al., "Distributed MEM True–Time Delay Phase Shifters and Wide–Band Switches", *IEEE Transactions on Microwave Theory and Techniqes*, vol. 46, No. 11 (11/98) pp. 1881–1890.
Hayden et al., "One and Two–Bit Low–Lss Cascadable MEMS Distributed X–Band Phase Shifters" *2000 IEEE*.
Wang et al., "VHF Free–Free Beam High–Q Micromechanical Resonators," *Technical Digest*, 12$^{th}$ Int'l IEEE Micro Electro Mechanical Systems Conference, Orlando, FL, Jan. 17–21, 1999, pp. 453–458.
Hilbert et al., "Thermoelectric MEMS Coolers".

* cited by examiner

*Primary Examiner*—Dean A. Reichard
*Assistant Examiner*—Nguyen Ha
(74) *Attorney, Agent, or Firm*—Allen, Dyer, Doppelt, Milbrath & Gilchrist, P.A.

(57) ABSTRACT

An electronic device, such as a filter or phase shifter, for example, includes a substrate, and a MEMS capacitor on the substrate and having a plurality of selectable capacitance values. The MEMS capacitor preferably includes a lower capacitor electrode on the substrate, and a movable bridge including end portions connected to the substrate laterally adjacent the lower capacitor electrode. The movable bridge may also include a conductive medial portion between the end portions defining an upper capacitor electrode suspended above the lower capacitor electrode and being movable between an upper position and a lower position by an electrostatic force generated between the capacitor electrodes. The upper and lower positions provide respective low and high selectable capacitance values. Moreover, the movable bridge may further include at least one travel limiting portion between the end portions for engaging adjacent substrate portions to keep the upper capacitor electrode in a predetermined spaced relation from the lower capacitor electrode when in the lower position. This travel limiting feature of the MEMS capacitor is relatively easy to fabricate and avoids the sticking or stiction problem of some other types of MEMS capacitors.

30 Claims, 2 Drawing Sheets

ELECTRONIC DEVICE INCLUDING MULTIPLE CAPACITANCE VALUE MEMS CAPACITOR AND ASSOCIATED METHODS

FIELD OF THE INVENTION

The invention relates to micro-electromechanical system (MEMS) devices, and, more particularly, to devices including MEMs tunable capacitors and related methods.

BACKGROUND OF THE INVENTION

Many common communications devices include components, such as phase shifters, resonators, filters, etc. which, in turn, include one or more tunable capacitors. The capacitance value of the tunable capacitor can be selectively varied to provide a desired capacitance in the circuit. The capacitance can typically be selected by varying the spacing or overlap between adjacent capacitor electrodes, and/or by changing the dielectric material between the electrodes.

Certain applications have developed wherein relatively small tunable capacitors are desirably used. Such capacitors can be made using MEMS manufacturing processes wherein very small movable components can be formed on a substrate using a combination of deposition, plating or other additive processes, and selective etching, and/or other lift-off techniques. Such techniques typically form a structure which is ultimately partially released or suspended to permit mechanical motion, typically as a result of an electrostatic force. The electrostatic force may be generated by applying an electrical voltage to spaced apart conductors. One common MEMS structure is a switch provided by a conductive beam anchored at one end and with an opposite end that can be brought into engagement with an adjacent contact via an applied electrostatic force.

One approach to providing a selectable circuit capacitance is disclosed in U.S. Pat. No. 5,880,921 to Tham et al. The patent discloses a plurality of capacitors connectable in parallel using MEMS switches to thereby provide a wide range of digitally controllable capacitance values. U.S. Pat. No. 5,808,527 to De Los Santos et al. discloses a similar use of MEMS switches to configure an array of capacitors to provide a desired capacitance value.

An article entitled "Distributed MEMS True-Time Delay Phase Shifters and Wide-Band Switches" by Barker et al. appearing in IEEE Transactions on Microwave Theory and Techniques, Vol. 46, No. 11, November 1998, at pp. 1881–1890, discloses a MEMS bridge having a capacitance value which is variable in an analog fashion based upon an applied pull-down voltage. More particularly, the bridge is anchored at opposing ends, with a conductive layer under the bridge defining one plate of the capacitor. The conductive layer is coated with an insulating layer of silicon nitride to prevent shorting should the bridge be brought fully downward.

Unfortunately, contact between the bridge and the underlying contact of the Barker et al. MEMS capacitor can frequently cause sticking, or "stiction" and thus render the device unusable. In addition, analog control of the position and thus capacitance can be very complicated, as individual capacitors may vary in a given device, and individual capacitors may also vary over time and/or temperature.

SUMMARY OF THE INVENTION

In view of the foregoing background, it is therefore an object of the invention to provide an electronic device including a MEMS capacitor and associated manufacturing method to produce the capacitor having selectable values and which is low cost, reliable, and readily controlled.

This and other objects, features and advantages in accordance with the present invention are provided by an electronic device comprising a substrate, and a MEMS capacitor on the substrate and having a plurality of selectable capacitance values. More particularly, the MEMS capacitor preferably includes a lower capacitor electrode on the substrate, and a movable bridge comprising end portions connected to the substrate laterally adjacent the lower capacitor electrode. The movable bridge may also include a conductive medial portion between the end portions defining an upper capacitor electrode suspended above the lower capacitor electrode. The upper capacitor electrode is thus movable between an upper position and a lower position by an electrostatic attraction force generated between the capacitor electrodes by an applied voltage. The upper and lower positions provide respective low and high selectable capacitance values. Moreover, the movable bridge may further include at least one travel limiting portion between the end portions for engaging adjacent substrate portions to keep the upper capacitor electrode in a predetermined spaced relation from the lower capacitor electrode when in the lower position. This travel limiting feature of the MEMS capacitor is relatively easy to fabricate and avoids the sticking or stiction problem of some other types of MEMS capacitors.

In some embodiments, the at least one travel limiting portion may comprise first and second travel limiting portions on opposite sides of the upper electrode or the medial portion of the movable bridge. The movable bridge may also have a shape defining a plurality of vertical steps. These vertical steps may descend from the end portions to respective travel limiting portions and ascend from respective travel limiting portions to the medial portion of the movable bridge. In other words, the movable bridge may have a stair-step construction, and wherein lowermost steps or portions define the travel limiting portions.

Another aspect of the invention is that the lower capacitor electrode may comprise a conductive uppermost surface portion so that an air gap provides a dielectric for the MEMS capacitor in both the upper and lower positions. In other words, a dielectric layer or coating need not be fabricated on the upper surface of the lower capacitor electrode.

The electronic device may further include a controller for applying control voltages to the lower and upper capacitor electrodes of the MEMS capacitor to select between discrete low and high capacitance values defined by the upper and lower positions, respectively. The controller, for example, could provide no voltage for the upper position and corresponding low capacitance value. For the lower position and corresponding high capacitance value, the controller could provide a voltage which exceeds a predetermined threshold voltage to provide the electrostatic force to bring the movable bridge down to the lower position until the travel limiting portions are engaged.

The movable bridge may be an integrally formed monolithic structure and may have an elongated strip shape. In addition, the movable bridge may have a configuration imparting an upward bias thereto. Accordingly, upon discontinuing the control or pull-down voltage when in the lower position, the capacitor will return to the upper position.

The MEMS capacitor may include a reinforcing layer on the medial portion of the movable bridge. In some embodiments, the substrate may comprise an insulating material. The lower capacitor electrode and the movable bridge may each comprise metal, such as gold, for example.

A method aspect in accordance with the invention is for making an electronic device including the MEMS capacitor as described above. The method may include forming a lower capacitor electrode on the substrate, and forming a movable bridge comprising end portions connected to the substrate laterally adjacent the lower capacitor electrode. A conductive medial portion is formed between the end portions defining the upper capacitor electrode suspended above the lower capacitor electrode. This upper capacitor electrode is movable between an upper position and a lower position by an electrostatic force generated between the lower and upper capacitor electrodes. The upper and lower positions provide respective low and high selectable capacitance values for the device.

Of course, forming the movable bridge may further comprise forming at least one travel limiting portion between the end portions for engaging adjacent substrate portions to keep the upper capacitor electrode in a predetermined spaced relation from the lower capacitor electrode when in the lower position. In addition, forming the lower capacitor electrode may comprise forming the lower capacitor electrode to have a conductive uppermost surface portion so that an air gap provides a dielectric for the MEMS capacitor in both the upper and lower positions.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used in an alternate embodiment to indicate similar elements.

Figure 1:
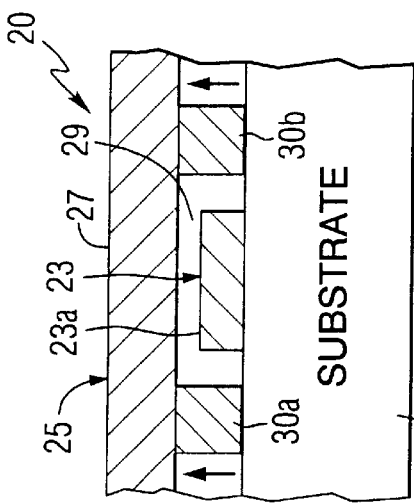
FIG. 1 is a schematic block diagram of an electronic device including the MEMS capacitor in accordance with the invention.
Figure 2:
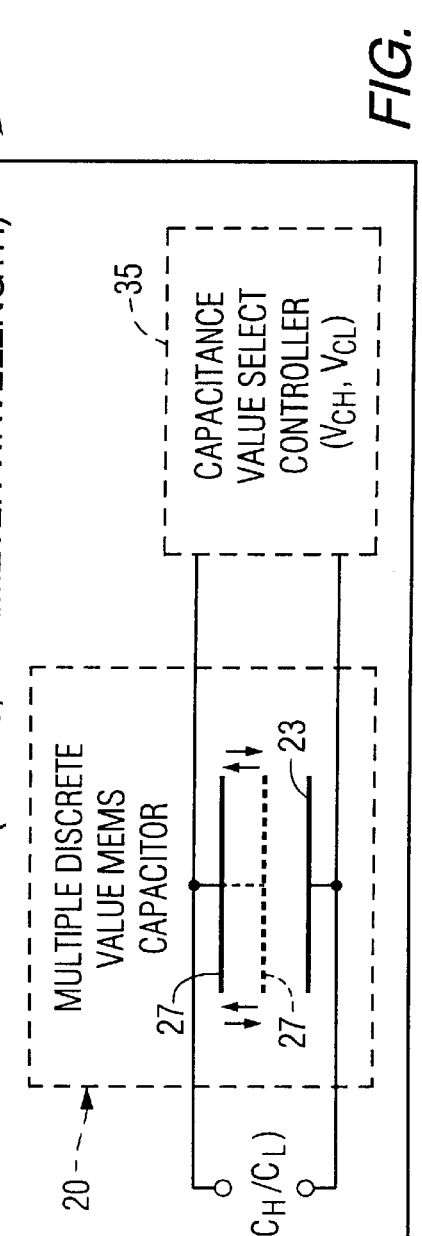
FIG. 2 is a greatly enlarged schematic cross-sectional view of the MEMS capacitor as in FIG. 1 illustrated with the upper capacitor electrode in the upper position.
Figure 3:
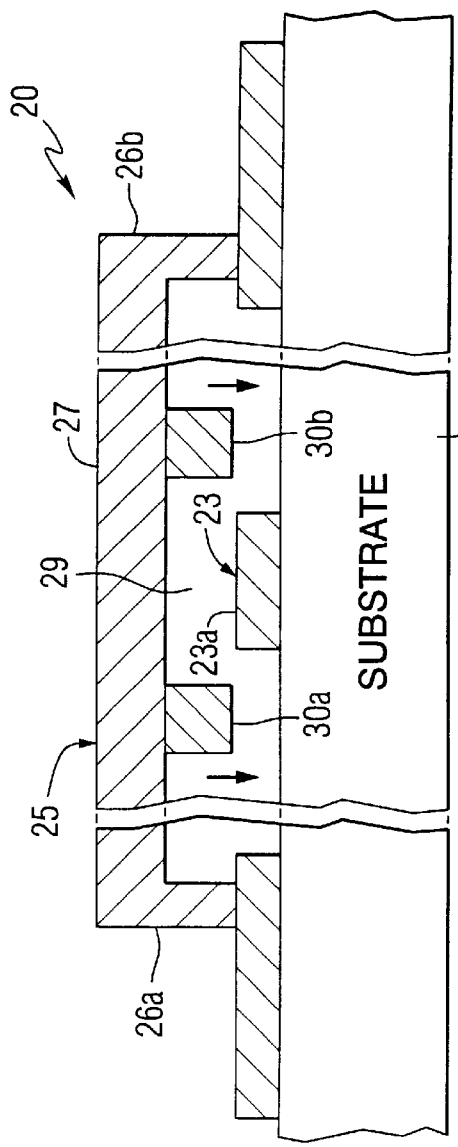
FIG. 3 is a schematic cross-sectional view of a central portion of the MEMS capacitor as in FIG. 2 illustrated with the upper capacitor electrode in the lower position.

Referring initially to FIGS. 1–3, a first embodiment of an electronic device 10 including a MEMS capacitor 20 in accordance with the invention is now described. The electronic device 10 may be any of a number of devices advantageously using a capacitor having a selectable capacitance value. For example, the electronic device 10 may be a distributed loaded transmission line phase shifter, an adjustable delay line, a tunable microwave filter, and adaptive impedance matching circuit, an adjustable coupled line, etc. as will be readily appreciated by those skilled in the art. The invention is also especially advantageous for use in the micro and millimeter wavelength ranges, although other ranges of operation are also possible.

The electronic device 10 includes a substrate 21, and the MEMS capacitor 20 on the substrate. The MEMS capacitor 20 has a plurality of selectable capacitance values. In the illustrated embodiment, the MEMS capacitor 20 includes a lower capacitor electrode 23 on the substrate 21, and a movable bridge 25 comprising end portions 26a, 26b connected to the substrate laterally adjacent the lower capacitor electrode. The movable bridge 25 also illustratively includes a conductive medial portion 27 between the end portions defining an upper capacitor electrode suspended above the lower capacitor electrode 23. The upper capacitor electrode 27 is movable between an upper position (FIG. 2) and a lower position (FIG. 3) by an electrostatic attraction force generated between the capacitor electrodes. The upper and lower positions provide respective high and low selectable capacitance values ($C_H$ or $C_L$) as will be readily appreciated by those skilled in the art.

The substrate 21 may comprise an insulating material, such as a ceramic, for example, for devices such as those mentioned above. In other embodiments, the substrate 21 may comprise a semiconductor material, or an insulating layer on a semiconductor substrate as will be appreciated by those skilled in the art. In yet other embodiments, the substrate 21 may comprise a printed circuit board.

The movable bridge 25 also illustratively includes first and second travel limiting portions 30a, 30b between the end portions 26a, 26b for engaging adjacent portions of the substrate 21 to keep the upper capacitor electrode 27 in a predetermined spaced relation from the lower capacitor electrode 23 even when in the lower position (FIG. 3). In other embodiments of the invention, the MEMS capacitor 20 may include only one or more than two such travel limiting portions, as will be appreciated by those skilled in the art. This travel limiting feature of the MEMS capacitor 20 is relatively easy to fabricate and avoids the sticking or stiction problems of some other types of MEMS capacitors.

The MEMS capacitor 20 in accordance with the present invention provides a number of advantages including multiple discrete value capability, low required operating voltage, the ability to be digitally controlled, small or compact size, high yield in manufacturing, low cost, low parasitics, fast switching, and high reliability. The electronic device 10 including the MEMS capacitor 20 overcomes a number of disadvantages and shortcomings of prior art devices. For example, ferrite phase shifters may be relatively large, have slow switching speeds, be relatively expensive, and require complex control circuitry. A diode or FET switched line may be relatively large and suffer from high losses. MMIC phase shifters may also have high losses and high costs. Bulk and tape ferroelectric devices may suffer from thermal sensitivity, create intermodulation problems, and require high operating voltages. Thin film ferroelectrics may also raise intermodulation concerns. MEMS switched line devices raise stiction and reliability problems. Analog MEMS capacitively loaded lines, as described in the Barker et al. reference above, require a continuous tuning voltage control, suffer from stiction and reliability problems, and the control voltage may drift over time.

The movable bridge 25 may be an integrally formed monolithic structure and may have an elongated strip shape. In addition, the movable bridge 25 may have a configuration imparting an upward bias thereto. Accordingly, upon discontinuing the control or pull-down voltage, the capacitor 20 will return to the upper position, that is, the lower capacitor value $C_L$.

The lower capacitor electrode 23 and the movable bridge 25 may each comprise metal, such as gold, for example. Other metals or conductive materials, such as polysilicon may also be used as will be appreciated by those skilled in the art. Gold may be an advantageous material when the substrate 21 comprises ceramic, for example.

Another aspect of the invention is that the lower capacitor electrode 23 may have a conductive uppermost surface portion 23a so that an air gap 29 provides the dielectric for the MEMS capacitor in both the upper and lower positions. A dielectric layer or coating need not be fabricated on the upper surface of the lower capacitor electrode 23 to prevent shorting with the upper capacitor electrode 27. This simplifies manufacturing and also avoids potential stiction difficulties as will be appreciated by those skilled in the art.

The electronic device 10 may further include a controller 35 (FIG. 1) for applying control voltages between the lower and upper capacitor electrodes 23, 27 of the MEMS capacitor 20 to select between discrete low and high capacitance values defined by the upper and lower positions, respectively. The controller 35, for example, could provide no voltage or a low voltage $V_{CL}$ for the upper position and low capacitance value $C_L$. For the lower position and high capacitance value $C_H$, the controller 35 could provide a voltage $V_{CH}$ which exceeds a threshold voltage to provide the electrostatic force to bring the movable bridge down 25 until the travel limiters 30a, 30b stop further downward movement. The control voltages may be in the range of about 20 volts or higher for the pull-down or higher voltage $V_{CH}$, and in the range of about 10 volts or less for the lower voltage $V_{CL}$. Other voltage ranges are also possible.

The MEMS capacitor 20 is readily controllable in a digital fashion between its two values. Accordingly, the control voltages need not have exacting tolerances. In addition, the capacitance values can be accurately set during the manufacturing process based upon the dimensions of the movable bridge 25 including the travel limiting portions 26a, 26b and its spacing with the lower capacitor electrode 23 as will be appreciated by those skilled in the art.

Figure 4:
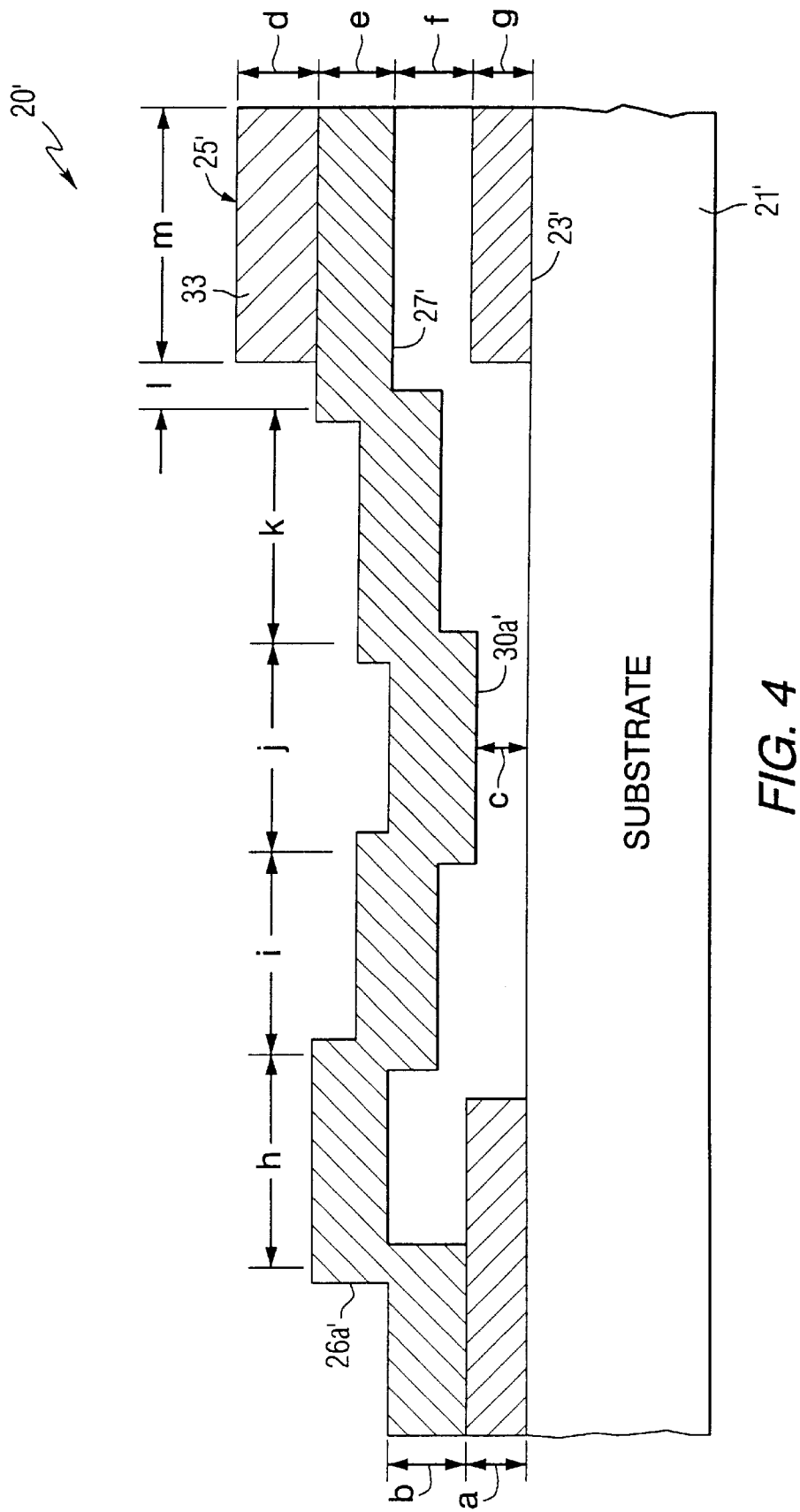
FIG. 4 is a greatly enlarged schematic cross-sectional view of one half of another embodiment of the MEMS capacitor in accordance with the invention.

Turning now additionally to FIG. 4 another embodiment of the MEMS capacitor 20' is illustrated. For clarity of explanation of the movable bridge 25', only one-half of its lateral extent is illustrated. The opposite half would simply be a mirror image to the half illustrated. The MEMS capacitor 20' also illustratively includes a reinforcing layer 33 on the medial portion or upper electrode 27' of the movable bridge 25'.

In this embodiment of the MEMS capacitor 20', the movable bridge 25' has an elongated strip shape with a span in a range of about 100 to 300 μm. The width need not be uniform across the entire span. In addition, the vertical profile or cross-sectional shape defines a plurality of vertical steps. It should be recognized that the edges and corners are only schematically illustrated as sharp, while in actual devices, the edges and corners are likely to be more rounded. These vertical steps may descend from the end portion 26a' to the travel limiting portion 30a' and then ascend from the travel limiting portion to the medial portion or upper electrode 27' of the movable bridge 25'. The movable bridge 25' in this embodiment may be considered to have a stair-step construction, and wherein lowermost steps or portions define the travel limiting portions 30a', 30b'.

Representative vertical dimensions (a–g) and horizontal dimensions (h–m) are given below in TABLES 1 and 2, respectively, for the MEMS capacitor 20' as shown in FIG. 4. These values are for purposes of illustration of one representative example only and are not limiting of the invention. Other dimensions may also be used and are contemplated by the present invention.

TABLE 1

Example Vertical Dimensions

| a | b | c | d | e | f | g |
|---|---|---|---|---|---|---|
| 1.5 μm | 2 μm | 1.25 μm | 2 μm | 2 μm | 2 μm | 1.5 μm |

TABLE 2

Example Horizontal Dimensions

| h | i | j | k | l | m |
|---|---|---|---|---|---|
| (2x) μm | (x) μm | (2x) μm | (x) μm | 2 μm | (2x) μm | where x=25 μm.

One method aspect in accordance with the invention is for making the electronic device 10, including the MEMS capacitors 20, 20' as described above. For example, the method may include forming a lower capacitor electrode 23 on the substrate 21, and forming a movable bridge 25 comprising end portions 26a, 26b connected to the substrate laterally adjacent the lower capacitor electrode. A conductive medial portion 27 extends between the end portions and defines an upper capacitor electrode suspended above the lower capacitor electrode 23 and being movable between an upper position and a lower position by an electrostatic force generated between the lower and upper capacitor electrodes.

The upper and lower positions provide the respective low and high selectable capacitance values. Forming the movable bridge 25 may further comprise forming at least one travel limiting portion 30a, 30b between the end portions 26a, 26b for engaging adjacent substrate portions to keep the upper capacitor electrode 27 in a predetermined spaced relation from the lower capacitor electrode 23 when in the lower position. Forming the lower capacitor electrode 23 may comprise forming the lower capacitor electrode to have a conductive uppermost surface portion 30a so that an air gap 29 provides a dielectric for the MEMS capacitor in both the upper and lower positions. In other embodiments, dielectric fluids, other than air, for example, may also be used.

Forming the movable bridge may comprise integrally forming the movable bridge as a monolithic structure connected to the substrate, and releasing all but the end portions of the movable bridge from the substrate. In other words, the MEMS capacitor 20 may be readily fabricated using conventional MEMS fabrication techniques as will be appreciated by those skilled in the art, without requiring further discussion herein.

Although the travel limiting portions 30a, 30b are advantageously provided in, on, or as part of the movable bridge 35 as described herein, those of skill in the art will appreciate that stops or other travel limiters could also be provided in other manners, such as in, on or as part of the surface of the substrate, for example. In addition, although only a dual or two discrete capacitance value MEMS capacitor has been described for clarity, those of skill in the art will appreciate that these teachings may be extended to a larger number of discrete levels. If desired, analog control of the spacing, and, hence, capacitance values, could also be accommodated in conjunction with the multiple discrete capacitance values. Accordingly, many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that other modifications and embodiments are intended to be included within the scope of the appended claims.

That which is claimed is:

1. An electronic device comprising:
a substrate; and
a micro-electromechanical system (MEMS) capacitor on said substrate and having -a plurality of selectable capacitance values, said MEMS capacitor comprising
a lower capacitor electrode on said substrate, and
a movable bridge comprising end portions connected to said substrate laterally adjacent said lower capacitor electrode, a conductive medial portion between said end portions defining an upper capacitor electrode suspended above said lower capacitor electrode and being movable between an upper position and a lower position by an electrostatic force generated between said lower and upper capacitor electrodes, the upper and lower positions providing respective low and high selectable capacitance values,
said movable bridge further comprising at least one travel limiting portion between said end portions for engaging adjacent substrate portions to keep said upper capacitor electrode in a predetermined spaced relation from said lower capacitor electrode when in the lower position.

2. An electronic device according to claim 1 wherein said at least one travel limiting portion comprises first and second travel limiting portions on opposite sides of the medial portion of said movable bridge.

3. An electronic device according to claim 2 wherein said movable bridge has a shape defining a plurality of vertical steps.

4. An electronic device according to claim 3 wherein the plurality of vertical steps descend from the end portions to respective travel limiting portions and ascend from respective travel limiting portions to the medial portion of said movable bridge.

5. An electronic device according to claim 1 wherein said lower capacitor electrode comprise a conductive uppermost surface portion so that an air gap provides a dielectric for said MEMS capacitor in both the upper and lower positions.

6. An electronic device according to claim 1 further comprising a controller for applying respective control voltages to the lower and upper capacitor electrodes of said MEMS capacitor to select between discrete low and high capacitance values defined by the upper and lower positions, respectively.

7. An electronic device according to claim 1 wherein said movable bridge is an integrally formed monolithic structure.

8. An electronic device according to claim 1 wherein said movable bridge has an elongated strip shape.

9. An electronic device according to claim 1 wherein said movable bridge has a configuration imparting an upward bias thereto.

10. An electronic device according to claim 1 further comprising a reinforcing layer on the medial portion of said movable bridge.

11. An electronic device according to claim 1 wherein said substrate comprises an insulating material.

12. An electronic device according to claim 1 wherein said lower capacitor electrode and said movable bridge each comprises metal.

13. An electronic device according to claim 1 wherein said lower capacitor electrode and said movable bridge each comprises gold.

14. An electronic device comprising:
a substrate; and
a micro-electromechanical system (MEMS) capacitor on said substrate and having discrete low and high selectable capacitance values, said MEMS capacitor comprising
a lower capacitor electrode on said substrate, and
a movable bridge comprising end portions connected to said substrate laterally adjacent said lower capacitor electrode, a conductive medial portion between said end portions defining an upper capacitor electrode suspended above said lower capacitor electrode and being movable between discrete upper and lower positions by an electrostatic force generated between said lower and upper capacitor electrodes, the discrete upper and lower positions providing the discrete low and high selectable capacitance values respectively,
said movable bridge further comprising first and second travel limiting portions on opposite sides of the medial portion of said movable bridge for engaging adjacent substrate portions to keep said upper capacitor electrode in a predetermined spaced relation from said lower capacitor electrode when in the lower position.

15. An electronic device according to claim 14 wherein said movable bridge has a shape defining a plurality of vertical steps.

16. An electronic device according to claim 15 wherein the plurality of vertical steps descend from the end portions to respective travel limiting portions and ascend from respective travel limiting portions to the medial portion of said movable bridge.

17. An electronic device according to claim 14 wherein said lower capacitor electrode comprise a conductive uppermost surface portion so that an air gap provides a dielectric for said MEMS capacitor in both the upper and lower positions.

18. An electronic device according to claim 14 further comprising a controller for applying respective control voltages to the lower and upper electrodes of said MEMS capacitor to select between the discrete low and high capacitance levels defined by the upper and lower positions, respectively.

19. An electronic device according to claim 14 wherein said movable bridge is an integrally formed monolithic structure.

20. An electronic device according to claim 14 wherein said movable bridge has an elongated strip shape.

21. An electronic device according to claim 14 wherein said movable bridge has a configuration imparting an upward bias thereto.

22. An electronic device according to claim 14 further comprising a reinforcing layer on the medial portion of said movable bridge.

23. An electronic device according to claim 14 wherein said substrate comprises an insulating material.

24. An electronic device according to claim 14 wherein said lower capacitor electrode and said movable bridge each comprises metal.

25. An electronic device comprising:
a substrate; and
a micro-electromechanical system (MEMS) capacitor on said substrate and having a plurality of selectable capacitance values, said MEMS capacitor comprising
a lower capacitor electrode on said substrate and comprising a conductive uppermost surface portion,
a movable bridge comprising end portions connected to said substrate laterally adjacent said lower capacitor electrode, a conductive medial portion between said end portions defining an upper capacitor electrode suspended above said lower capacitor electrode and being movable between an upper position and a lower position by an electrostatic force generated between said lower and upper capacitor electrodes, the upper and lower positions providing respective low and high selectable capacitance values, and at least one travel limiter to keep said upper capacitor electrode in a predetermined spaced relation from said lower capacitor electrode when in the lower position and so that an air gap provides a dielectric for said MEMS capacitor in both the upper and lower positions.

26. An electronic device according to claim 25 wherein said at least one travel limiter comprises first and second travel limiting portions on opposite sides of the medial portion of said movable bridge.

27. An electronic device according to claim 26 wherein said movable bridge has a shape defining a plurality of vertical steps.

28. An electronic device according to claim 27 wherein the plurality of vertical steps descend from the end portions to respective travel limiting portions and ascend from respective travel limiting portions to the medial portion of said movable bridge.

29. An electronic device according to claim 25 further comprising a controller for applying respective control voltages to the lower and upper capacitor electrodes of said MEMS capacitor to select between discrete low and high capacitance values defined by the upper and lower positions, respectively.

30. An electronic device according to claim 25 wherein said movable bridge is an integrally formed monolithic structure.

\* \* \* \* \*